United States Patent
Kim et al.

(10) Patent No.: US 9,515,129 B2
(45) Date of Patent: Dec. 6, 2016

(54) ORGANIC LIGHT EMITTING DISPLAY APPARATUS AND MANUFACTURING METHOD THEREOF

(71) Applicant: LG Display Co., Ltd., Seoul (KR)

(72) Inventors: Eun-Ah Kim, Chungcheongnam-do (KR); Joon-Suk Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/317,064

(22) Filed: Jun. 27, 2014

(65) Prior Publication Data
US 2015/0001507 A1    Jan. 1, 2015

(30) Foreign Application Priority Data

Jun. 28, 2013 (KR) .................. 10-2013-0075544
Jun. 10, 2014 (KR) .................. 10-2014-0070124

(51) Int. Cl.
| | |
|---|---|
| H01L 29/08 | (2006.01) |
| H01L 35/24 | (2006.01) |
| H01L 51/00 | (2006.01) |
| H01L 27/32 | (2006.01) |
| H01L 51/56 | (2006.01) |

(52) U.S. Cl.
CPC ....... *H01L 27/3244* (2013.01); *H01L 27/3246* (2013.01); *H01L 51/56* (2013.01); *H01L 27/3276* (2013.01); *H01L 2227/323* (2013.01)

(58) Field of Classification Search
USPC .......................................................... 257/40
See application file for complete search history.

(56) References Cited

U.S. PATENT DOCUMENTS

| | | |
|---|---|---|
| 6,407,408 B1 | 6/2002 | Zhou et al. |
| 6,727,645 B2 * | 4/2004 | Tsujimura ........... H01L 27/3246 257/40 |
| 2007/0194307 A1 | 8/2007 | Kim et al. |

FOREIGN PATENT DOCUMENTS

| | | |
|---|---|---|
| CN | 1465100 A | 12/2003 |
| EP | 2503851 A1 | 9/2012 |

(Continued)

OTHER PUBLICATIONS

Extended European Search Report issued in counterpart European Patent Application No. 14173094.5 dated Dec. 18, 2014.

(Continued)

*Primary Examiner* — Telly Green
(74) *Attorney, Agent, or Firm* — Morgan, Lewis & Bockius LLP

(57) ABSTRACT

An organic light emitting display apparatus includes pixel areas, each pixel area having emission and non-emission areas; a first electrode corresponding to the emission area of each pixel area; a bus electrode corresponding to at least a portion of the non-emission areas; an adherent pattern on a portion of the bus electrode; a separation pattern covering a top portion of the bus electrode and having an inverted tapered shape cross section defining a crevice under the separation pattern and above the bus electrode; an organic layer on the first electrode and the separation pattern, and further formed on a remaining portion of the bus electrode except a portion corresponding to the crevice under the separation pattern, the organic layer having an emission layer; and a second electrode on the organic layer and disposed in the crevice, the second electrode electrically contacting the bus electrode via the crevice.

14 Claims, 12 Drawing Sheets

(56) References Cited

FOREIGN PATENT DOCUMENTS

| KR | 20100128794 A | * | 12/2010 | ............. | H01L 51/56 |
| WO | 02/089210 A1 | | 7/2002 | | |
| WO | 02/089210 A1 | | 11/2002 | | |

OTHER PUBLICATIONS

First Notification of Office Action dated Jul. 21, 2016 from the State Intellectual Property Office of China in counterpart Chinese application No. 201410294256.8.

* cited by examiner

ORGANIC LIGHT EMITTING DISPLAY APPARATUS AND MANUFACTURING METHOD THEREOF

This application claims the benefit of Korean Patent Application No. 10-2013-0075544, filed on Jun. 28, 2013, and Korean Patent Application No. 10-2014-0070124, filed on Jun. 10, 2014, both of which are hereby incorporated by reference as if fully set forth herein.

BACKGROUND OF THE INVENTION

Field of the Invention

The present invention relates to an organic light emitting display apparatus, and more particularly, to an organic light emitting display apparatus with improved reliability and a manufacturing method thereof.

Discussion of the Related Art

Recent transition into an information-oriented society has caused rapid development in the field of displays to visually represent electrical information signals. Correspondingly, a variety of flat panel display apparatuses exhibiting excellent properties, such as thin profile, light weight and low power consumption, have been developed.

Representative examples of these flat panel display apparatuses may include liquid crystal display (LCD) apparatuses, plasma display panel (PDP) apparatuses, field emission display (FED) apparatuses, electro luminescence display (ELD) apparatuses, electro-wetting display (EWD) apparatuses, and organic light emitting display (OLED) apparatuses.

All of the aforementioned flat panel display apparatuses essentially include a flat display panel to display an image. The flat display panel is fabricated by bonding a pair of substrates to face each other with an inherent light emitting material or a polarizer interposed therebetween, and includes a display face defined by a display region and a peripheral non-display region around the display region. The display region is defined by a plurality of pixel areas.

Among the flat panel display apparatuses, organic light emitting display apparatuses are configured to display an image using self-illuminating organic light emitting devices. That is, the organic light emitting display apparatuses include a plurality of organic light emitting devices corresponding to a plurality of pixel areas.

Typically, such an organic light emitting device includes first and second electrodes arranged facing each other, and an organic layer formed of an organic material between the first and second electrodes to attain electro-luminescence based on a drive current between the first and second electrodes.

One of the first and second electrodes (hereinafter referred to as "first electrode") corresponds to each pixel area, and the other (hereinafter referred to as "second electrode") corresponds to all of the pixel areas in common.

The second electrode is formed in a wide area to correspond to all of the pixel areas, and thus has a higher resistance than that of the first electrode. In particular, when the organic light emitting display apparatus is a top emission type, light is emitted through the second electrode. Therefore, the second electrode may be formed of a transparent conductive material that is as thin as possible to maintain light emission efficiency, i.e., brightness of each pixel area, thereby having higher resistance.

The higher resistance of the second electrode, however, causes a greater voltage drop (IR drop, I: electrical current, R: electrical resistance), and therefore the respective pixel areas may have different brightness based on a distance from a power source. That is, the high resistance of the second electrode deteriorates brightness uniformity throughout the pixel areas. In addition, the high resistance of the second electrode increases power consumption of the organic light emitting display apparatus for acquisition of brightness over a critical value, despite the voltage drop.

In particular, as the area of the organic light emitting display apparatus increases, deterioration of brightness uniformity and increase of power consumption due to the high resistance of the second electrode are worsened, which restricts increase in the area of the organic light emitting display apparatus.

To solve the above described problems, a general organic light emitting display apparatus may further include a bus electrode formed of a lower resistance material than the second electrode and connected to the second electrode, to reduce a resistance of the second electrode.

In this case, the bus electrode is disposed facing the second electrode, and an organic layer is interposed between the bus electrode and the second electrode. Thus, for connection of the second electrode and the bus electrode, at least a portion of the bus electrode must be exposed without formation of the organic layer thereon.

In one example, to expose at least a portion of the bus electrode, selective etching of the organic layer may be contemplated. However, this etching may cause damage to the entire organic layer and leave an etched organic material with impurities, thereby resulting in deterioration in the reliability of the organic light emitting display apparatus.

SUMMARY OF THE INVENTION

Accordingly, the present invention is directed to an organic light emitting display apparatus and a manufacturing method thereof that substantially obviate one or more problems due to limitations and disadvantages of the related art.

An object of the present invention is to provide an organic light emitting display apparatus and a manufacturing method thereof, in which connection between a bus electrode and a second electrode may be accomplished without selective removal of an organic layer, resulting in improved reliability.

Additional features and advantages of the invention will be set forth description which follows, and in part will be apparent from the description, or may be learned by practice of the invention. The objectives and other advantages of the invention may be realized and attained by the structure particularly pointed out in the written description and claims hereof as well as the appended drawings.

To achieve these objects and other advantages and in accordance with the purpose of the disclosure, as embodied and broadly described herein, an organic light emitting display apparatus comprises a plurality of pixel areas, each pixel area comprising an emission area and a non-emission area; a first electrode corresponding to the emission area of each pixel area; a bus electrode corresponding to at least a portion of the non-emission areas of the plurality of pixel areas; an adherent pattern formed on a portion of the bus electrode; a separation pattern covering at least a top portion of the bus electrode and having an inverted tapered shape cross section to define a crevice under the separation pattern and above the bus electrode; an organic layer on the first electrode and the separation pattern, and further formed on a remaining portion of the bus electrode except for a portion corresponding to the crevice which is disposed under the separation pattern, wherein the organic layer includes an emission layer; and a second electrode on the organic layer and further disposed in the crevice, the second electrode electrically contacting the bus electrode via the crevice.

In another aspect, a method of manufacturing an organic light emitting display apparatus comprises forming a plurality of thin film transistors corresponding to a plurality of pixel areas; forming overcoat layer covering the plurality of thin film transistors; forming a first electrode corresponding to an emission area of each pixel area and a bus electrode corresponding to at least a portion of non-emission areas of the plurality of pixel areas on the overcoat layer; forming an adherent pattern on a portion of the bus electrode; forming a separation pattern covering at least a top portion of the adherent pattern and having an inverted tapered shape cross section to define a crevice under the separation pattern and above the bus electrode; forming an organic layer on the first electrode and the separation pattern, and on a remaining portion of the bus electrode except for a portion corresponding to the crevice which is disposed under the separation pattern, wherein the organic layer includes an emission layer; and forming a second electrode on the organic layer and in the crevice, the second electrode electrically contacting the bus electrode via the crevice.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. In the drawings.

DETAILED DESCRIPTION OF THE INVENTION

Hereinafter, an organic light emitting display apparatus and a manufacturing method thereof according to various embodiments of the present invention will be described in detail with reference to the accompanying drawings.

First, an organic light emitting display apparatus according to various embodiments of the present invention will be described with reference to FIGS. 1 to 4.

Figure 1:
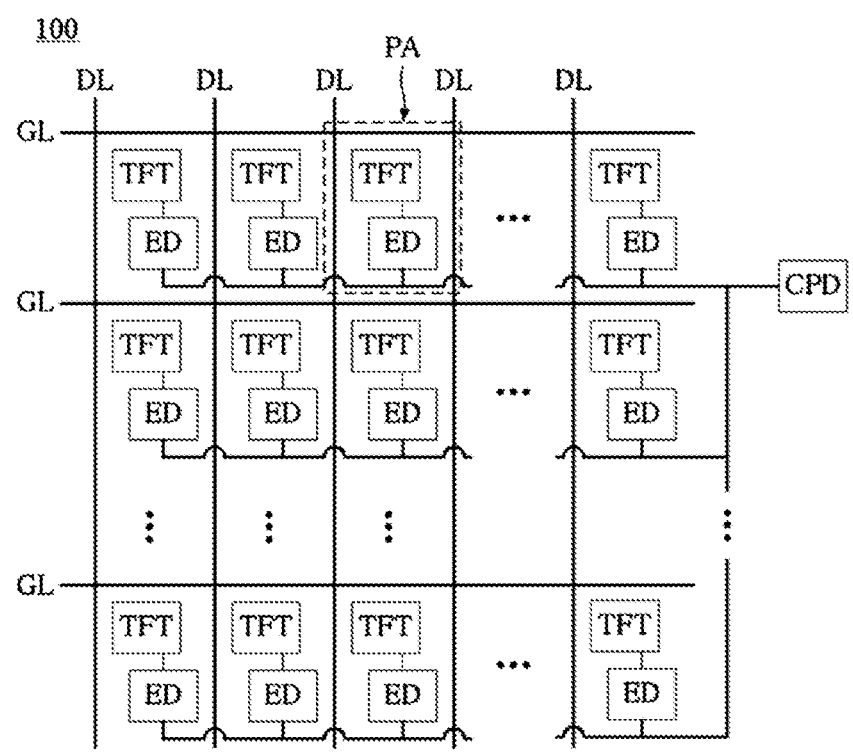
FIG. 1 is an equivalent circuit diagram showing an organic light emitting display apparatus according to various embodiments according to the present invention.
Figure 2:
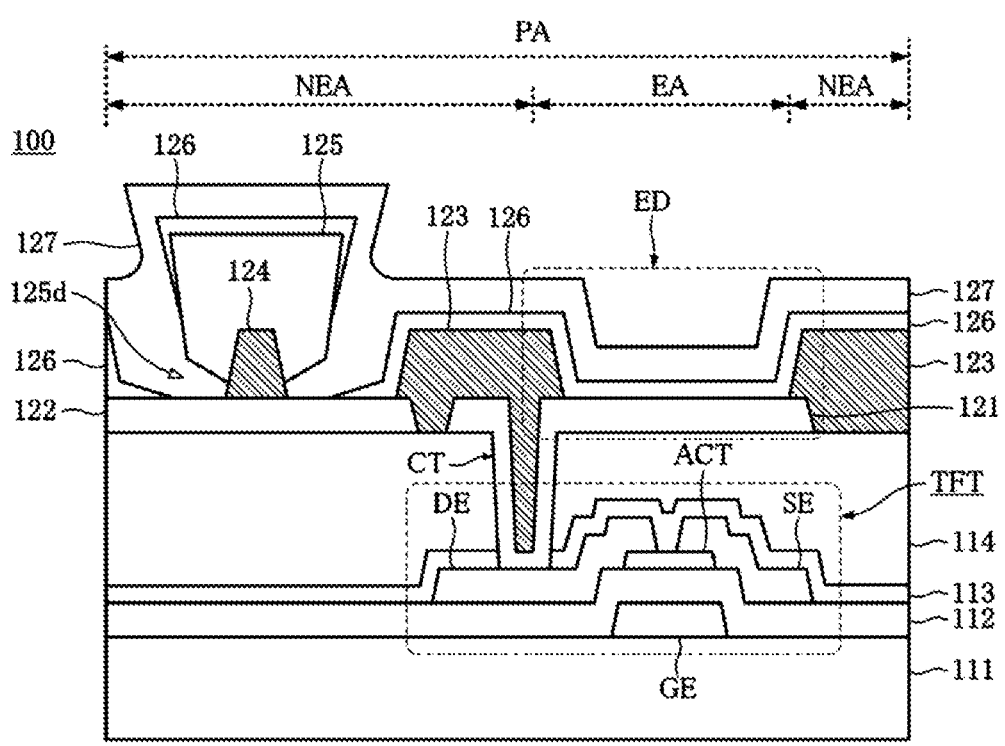
FIG. 2 is a sectional view showing each pixel area of FIG. 1.
Figure 3A:
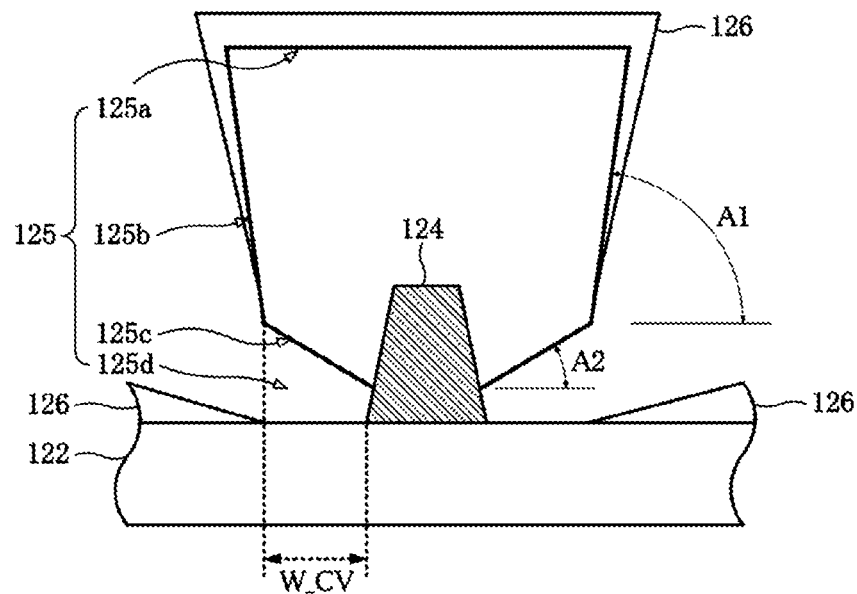
FIG. 3A and FIG. 3B are a detailed views showing a bus electrode, an adherent pattern and a separation pattern as illustrated in FIG. 2.
Figure 3B:
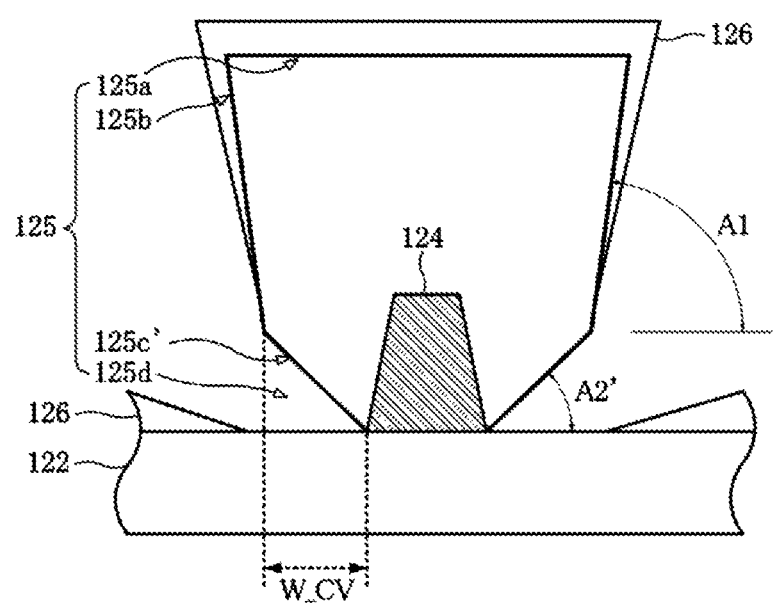
Figure 4:
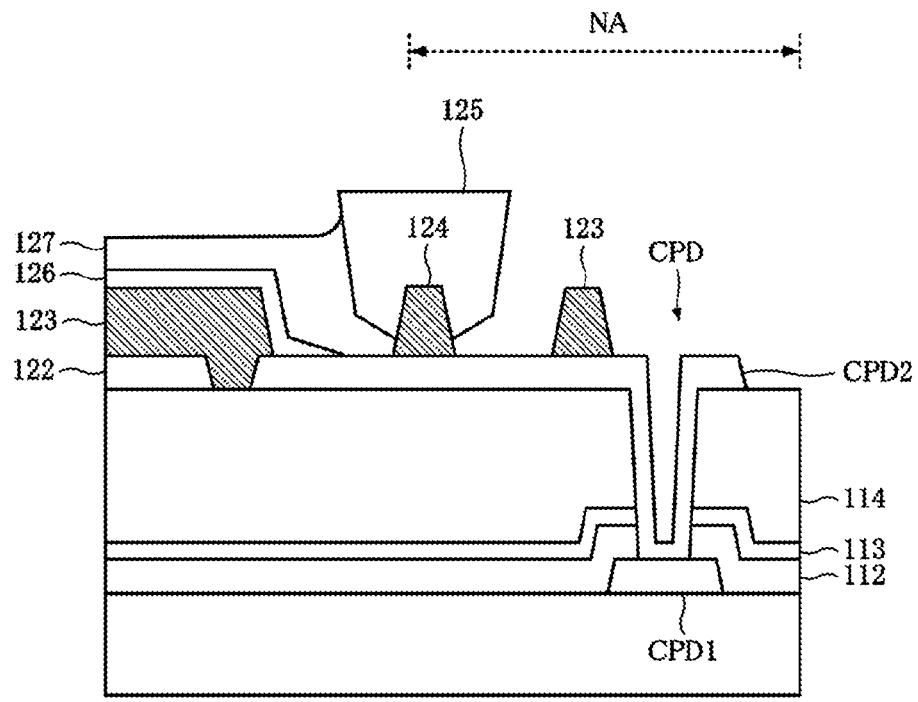
FIG. 4 is a sectional view showing a common pad as illustrated in FIG. 1.

FIG. 1 is an equivalent circuit diagram showing an organic light emitting display apparatus of various embodiments according to the present invention, FIG. 2 is a sectional view showing each pixel area of FIG. 1, FIG. 3 is a detailed view showing a bus electrode, an adherent pattern and a separation pattern as illustrated in FIG. 2, and FIG. 4 is a sectional view showing a common pad as illustrated in FIG. 1.

As exemplarily shown in FIG. 1, the organic light emitting display (OLED) apparatus 100 according to various embodiments of the invention includes gate lines GL and data lines DL crossing each other to define a plurality of pixel areas PA, a plurality of thin film transistors TFT corresponding to the plurality of pixel areas PA, and a plurality of organic light emitting devices ED corresponding to the plurality of pixel areas PA.

The organic light emitting display apparatus 100 may further include a common pad CPD connected to the plurality of organic light emitting devices ED in common and also connected to an external circuit.

The plurality of organic light emitting devices ED is connected to the plurality of thin film transistors TFT one to one. Thus, each organic light emitting device ED emits light based on a drive current corresponding to a potential difference between the thin film transistor TFT and the common pad CPD.

As exemplarily shown in FIG. 2, each pixel area PA includes an emission area and a non-emission area. The term "emission area" may refer to an area (of a pixel area PA) where light may be emitted, e.g., by an organic light emitting device ED. The term "non-emission area" may refer to an area (of the pixel area PA) where light may not be emitted, for example an area including driving circuitry, e.g., one or more thin film transistors TFT, for driving the organic light emitting device ED in the emission area EA.

The organic light emitting display apparatus includes a substrate 111, the thin film transistor TFT formed on the substrate 111, a protection layer 113 covering the thin film transistor TFT, and an overcoat layer 114 evenly formed on the protection layer 113.

For example, the thin film transistor TFT includes a gate electrode GE formed on the substrate and connected to the gate line GL, a gate insulating layer 112 covering the gate electrode GE, an active layer ACT formed on the gate insulating layer 112 and overlapping the gate electrode GE, a source electrode SE and a drain electrode DE formed on the gate insulating layer 112 and separated from each other. The source electrode SE is in contact with a side of the active layer ACT, and the drain electrode DE is in contact with the other side of the active layer ACT. One of the source electrode SE and the drain electrode DE is connected to the data line DL, and the other one is connected to the organic light emitting devices ED. For example, the source electrode SE is connected to the data line DL, and the drain electrode DE is connected to the organic light emitting devices ED.

However, FIG. 2 shows only an example of the thin film transistor TFT, the thin film transistor TFT according to various embodiments of the present invention may have another structure known to those skilled in the art.

In addition, the organic light emitting display apparatus 100 further includes a first electrode 121 corresponding to the emission area EA of each pixel area PA, a bus electrode 122 corresponding to at least a portion of the non-emission area NEA of the plurality of pixel areas PA, a bank 123 covering a rim of the first electrode 121, a adherent pattern 124 formed on at least a portion of the bus electrode 122, a separation pattern 125 covering at least a portion of the adherent pattern 124 and having an inverted tapered cross section, an organic layer 126 formed on the first electrode 121, and a second electrode 127 formed on the organic layer 126.

At least a portion of the bus electrode 122 surrounding the adherent pattern 124 may be a crevice 125d. (See, e.g., FIGS. 3A and 3B.) In the crevice 125d, the portion of bus electrode 122 is hidden by the separation pattern 125, such that the organic layer 126 is not formed by the separation pattern 125. That is, the organic layer 126 is formed on the first electrode 121, the bank 123 and the adherent pattern 124, but also on a remaining area of the bus electrode 122 except for the crevice 125d which is hidden by the separation pattern 125.

The second electrode 127 is formed on the organic layer 126, but also in the crevice 125d. (See, e.g., FIGS. 3A and 3B.) Therefore, the second electrode 127 is in contact with the bus electrode 122 by the crevice 125d.

The first electrode 121 is formed on the overcoat layer 114, and corresponds to the emission area EA of each pixel area PA. The first electrode 121 is connected to the thin film transistor TFT through a contact hole CT. The contact hole CT penetrates the protection layer 113 and the overcoat layer 114 to expose a portion of the drain electrode DE of the thin film transistor TFT.

The bus electrode 122 is formed on the overcoat layer 114, in the same manner as the first electrode 121. The bus electrode 122 corresponds to at least a portion of the non-emission area NEA of the plurality of pixel areas PA. The bus electrode 122 is spaced apart from the first electrode 121 not to connect with the first electrode 121. The bus electrode 122 is connected to the common pad (CPD of FIG. 1).

The first electrode 121 and the bus electrode 122 are formed of a conductive material.

In one example, when the organic light emitting display apparatus 100 is a bottom emission type, each of the first electrode 121 and the bus electrode 122 is formed of a transparent conductive material which has a work function similar to the organic layer 126.

Alternatively, when the organic light emitting display apparatus 100 is a top emission type, each of the first electrode 121 and the bus electrode 122 may be part of a stack of multiple layers, including a reflective conductive material. In one example, each of the first electrode 121 and the bus electrode 122 may include a first layer formed of any one of Al and Ag or an alloy thereof, and a second layer formed of a material having a work function similar to the organic layer 126. In this case, the second layer may be formed of indium tin oxide (ITO). The second layer may be disposed between the first layer and the organic layer 126. The first layer may be disposed on the overcoat layer 114 and the second layer may be disposed on the first layer.

The first electrode 121 and the bus electrode 122 are formed of same material and same structure via only one mask process. However, it is to be understood that the first electrode 121 and the bus electrode 122 may be formed of different materials or may have different configurations via different processes.

In addition, although not shown in detail in FIG. 2, the bus electrode 122 may be patterned in various ways so long as it is insulated from the first electrode 121. For example, the bus electrode 122 may be spaced apart from the first electrode 121 by a given distance, and may be arranged in the same direction as at least one of the gate lines (GL of FIG. 1) and the data lines (DL of FIG. 1). For example, the bus electrode 122 may run parallel to the gate lines or parallel to the data lines. Or, the bus electrode 122 may be formed in mesh-shape.

The bank 123 is formed on the overcoat layer 114. The bank 123 overlaps the rim of each of the first electrode 121 and bus electrode 122.

In addition, the bank 123 is formed of an organic material in consideration of adhesion to the organic layer 126. For example, the bank 123 may be formed of a polyimide-based material or photo-acryl. For example, at least one sidewall of the bank 123 may be inclined with respect to an upper side or surface of the first electrode 121 and/or bus electrode 122. For example, an angle between the sidewall or sidewalls of the bank 123 and the upper side or surface of the first electrode 121 and/or bus electrode 122 may be greater than 90°. For example, a base area or area of a bottom side or lower surface of the bank 123 may be larger than an area of the upper side or surface of the bank 123. The bank 123 may have a trapezoidal shaped cross section.

The bank 123 described above is configured to cover stepped portions of the first electrode 121 and bus electrode 122, thereby preventing early deterioration of the organic layer 126 at the stepped portions of the first and bus electrodes 121, 122.

The adherent pattern 124 is formed on at least a portion of the bus electrode 122.

The adherent pattern 124 may be formed simultaneously with the formation of the bank 123. That is, the adherent pattern 124 is formed of the same material as the bank 123 at the same layer as the bank 123, and has a tapered cross section similar to the bank 123. For example, at least one sidewall of the adherent pattern 124 may be inclined with respect to an upper side or surface of the bus electrode 122. For example, an angle between the at least one sidewall of the adherent pattern 124 and the upper side or surface of the bus electrode 122 may be greater than 90°. For example, a base area or area of a bottom side or lower surface of the adherent pattern 124 may be larger than an area of the upper side or surface of the adherent pattern 124. For example, the adherent pattern 124 may have a trapezoidal cross section. For example, the adherent pattern 124 may be formed of an organic material, e.g., an organic insulating material, e.g. a polyimide-based material or photo-acryl.

In other words, the bank 123 and the adherent pattern 124 may be formed simultaneously by patterning an organic material on the entire surface of the overcoat layer 114. As such, upper surfaces of the bank 123 and the adherent pattern 124 may have the same height on the basis of the overcoat layer 114.

As shown in FIG. 2 and FIG. 3A, the separation pattern 125 is formed covering at least a top portion of the adherent pattern 124 and has an inverted tapered shape-cross section. In one or more embodiments, the term "inverted tapered shape" may include or refer to a shape whose lateral cross-sectional area or diameter increases from a bottom side towards a top side of the shape. For example, with respect to the separation pattern 125, the term "inverted tapered shape" may be understood as meaning that a lateral cross-sectional area or diameter of the separation pattern 125 near the bus electrode 122 (e.g., a base area or diameter of the separation pattern 125) is smaller than a lateral cross-sectional area or diameter of the separation pattern 125 away from the bus electrode 122 (e.g., an area or diameter of a top side of the separation pattern 125). In one or more embodiments, the separation pattern 125 covers only at least a partial thickness of the adherent pattern 124 from an upper surface of the adherent pattern 124. Thus, the separation pattern 125 comes into contact with a portion of the adherent pattern 124. In this regard, the separation pattern 125 is spaced apart from the bus electrode 122. For example, the separation pattern 125 may cover an upper side or surface of the adherent pattern 124 and a portion, e.g., an upper portion, of the at least one sidewall of the adherent pattern 124.

Alternatively, as shown in FIG. 3B, the separation pattern 125 may be configured to cover the entire adherent pattern 124. In this regard, the separation pattern 125 is in contact with the bus electrode 122. For example, the separation pattern 125 may cover the upper surface and the at least one sidewall of the adherent pattern 124. In one or more embodiments, the separation pattern 125 may not be formed directly on the bus electrode 122.

As the separation pattern 125 is formed to cover at least the top portion of the adherent pattern 124, the height of an upper surface of the separation pattern 125 is higher than the height of the upper surface of each of the bank 123 and the adherent pattern 124 on the overcoat layer 114.

In addition, the separation pattern 125 has the inverted tapered shape-cross section having a wider width than the adherent pattern 124. Therefore, the separation pattern 125 serves as a shield covering at least a portion of the bus electrode 122 surrounding the adherent pattern 124 upon formation of the organic layer 126.

More specifically, as exemplarily shown in FIG. 3A and FIG. 3B, the cross section of the separation pattern 125 is in the inverted tapered shape defined by an upper edge 125a, right and left side edges extending from the upper edge 125a to the bus electrode 122 along the adherent pattern 124. The each of the right and left side edges being inclined by two or more different gradients A1 and A2. The term "gradient" may refer to a gradient or angle relative to an upper surface or top side of the bus electrode 122, for example a surface or side of the bus electrode 122, on which the adherent pattern 124 is formed. In this case, the separation pattern 125 may have a symmetrical cross section.

In one example, at least one side edge of the separation pattern 125 includes a first side 125b adjoining the upper edge 125a and inclined by a first gradient A1, and a second side 125c extending from the first side 125b to the bus electrode 122 along the adherent pattern 124 and inclined by a second gradient A2 smaller than the first gradient A1.

In this regards, the first gradient A1 may be greater than or equal to 45°, also smaller than or equal to 90°. (45°≤A1≤90°) The second gradient A2 may be greater than or equal to 0°, also smaller than the first gradient A1. (0°≤A2≤A1)

As mentioned above, the separation pattern 125 is formed to have wider width than that of the adherent pattern 124, and inversed tapered shape-cross section. Therefore, the crevice 125d of the bus electrode 122 which surrounds the adherent pattern 124 and is hidden by the separation pattern 125 is occurred.

Further, the second gradient A2 is closer to 0°, the width W_CV of the crevice 125d corresponding to the thickness of the separation pattern 125 is wider, and therefore the shield function of the separation pattern 125 is more useful.

In this case, the width W_CV of the crevice 125d is determined from a junction of the first and second sides 125b, 125c to the adherent pattern 124. That is, the crevice 125d is not extended to inside of the adherent pattern 124. Thus, the uniformity of the width W_CV of the crevice 125d is improved. As shown in FIG. 3A and FIG. 3B, each of the two side edges defining the cross-section of the separation pattern 125 may include the first side 125b and the second side 125c inclined by two different gradients. In accordance with other embodiments, at least one of the two side edges (e.g., both of the two side edges) defining the cross-section of the separation pattern 125 may include three or more sides inclined by three or more different gradients, respectively.

In addition, the separation pattern 125 may be formed of various materials so long as such materials may be patterned into an inverted tapered shape having a side edge inclined by two or more gradients. One example of a patternable material may be a photopatternable material such as a photoresist. For example, the separation pattern 125 may be formed via activation of a negative photoresist material and developing or polarization of the same. For example, the separation pattern 125 is formed of a negative photoresist material selected from polyimide resin, polyacryl resin and novolac resin.

In the case which the separation pattern 125 is directly disposed on the bus electrode 122 without the adherent pattern 124 interposed therebetween, the separation pattern 125 may be peeled easily because of low adhesion between the separation pattern 125 and the bus electrode 122. This may deteriorate not only resolution due to spots, but also the reliability of the organic light emitting display apparatus.

However, in accordance with various embodiments of the present invention, the separation pattern 125 is disposed on the top portion of the adherent pattern 124, rather than the bus electrode 122. In addition, the adherent pattern 124 is formed of an organic material having higher adhesion to the separation pattern 125 than an inorganic material of the bus electrode 122. Therefore, the separation pattern 125 attains an attached portion equal to a contact area with the adherent pattern 124. In this way, peeling of the separation pattern 125 and deterioration of resolution due to spots may be prevented, and the reliability of the organic light emitting display apparatus may be improved.

In addition, it is unnecessary to increase the size of the separation pattern 125, i.e., cross sectional areas at upper and lower surfaces of the separation pattern 125, in order to improve the adhesion reliability of the separation pattern 125. Hence, the separation pattern 125 may have a reduced size, which may be advantageous to increase an opening ratio.

The width W_CV of the crevice 125d may be beyond a critical range by the adherent pattern 124. As a result, uniformity of the width W_CV of the crevice 125d may be improved, and connection reliability between the bus electrode 122 and the second electrode 127 through the crevice 125d may be improved.

As shown in FIG. 2, the organic layer 126 is formed on the first electrode 121, the bank 123 and the separation pattern 125, but also on the remaining area of the bus electrode 122 except in the crevice 125d. The organic layer 126 includes an emission layer (not shown) formed of an organic light emitting material.

The organic layer 126 is formed by an anisotropic deposition method, and therefore not formed in the crevice 125d of the bus electrode 122 which is hidden by the separation pattern 125.

Although not shown in detail in FIGS. 2, 3A and 3B, the organic layer 126 may be a stack of multiple layers formed of organic materials having different components or compositions. In one example, the organic layer 126 may be a stack of multiple layers including an electron injection layer, an electron transportation layer, the emission layer, a hole transportation layer, and a hole injection layer.

The second electrode 127 is formed on the organic layer 126. Since the second electrode 127 is formed by an isotropic deposition method, such as atomic layer deposition (ALD) or sputtering, the second electrode 127 is formed on the organic layer 126 but also in the crevice 125d of the bus electrode 122 in which the organic layer 126 is not formed by the separation pattern 125. Therefore, the second electrode 127 is electrically connected to the bus electrode 122 through the crevice 125d, which is created by the separation pattern 125.

In this way, the organic light emitting device ED is formed on emission area EA of each pixel area PA and includes the first and second electrodes 121, 127 facing each other with the organic layer 126 interposed between the first and second electrodes 121, 127.

As exemplarily shown in FIG. 4, the common pad CPD is formed in a non-display region NA around a display region. The display region may be defined by the plurality of pixel areas PA of FIG. 2. The common pad CPD may include a first pad layer CPD1 formed simultaneously with at least one of the gate lines GL and the data lines DL, and a second pad layer CPD2 formed on the overcoat layer 114. The second pad layer CPD2 may be formed simultaneously with the first electrode 121 and the bus electrode 122. In this case, the first and second pad layers CPD1, CPD2 are connected to each other via a contact hole penetrating the overcoat layer 114, the protection layer 113 and the gate insulating layer 112.

The second pad layer CPD2 of the common pad CPD continuously extends from the bus electrode 122 to achieve connection between the common pad CPD and the bus electrode 122.

Next, a manufacturing method of the organic light emitting display apparatus in accordance with various embodiments of the present invention will be described with reference to FIGS. 5, 6, and 7A to 7I.

Figure 5:
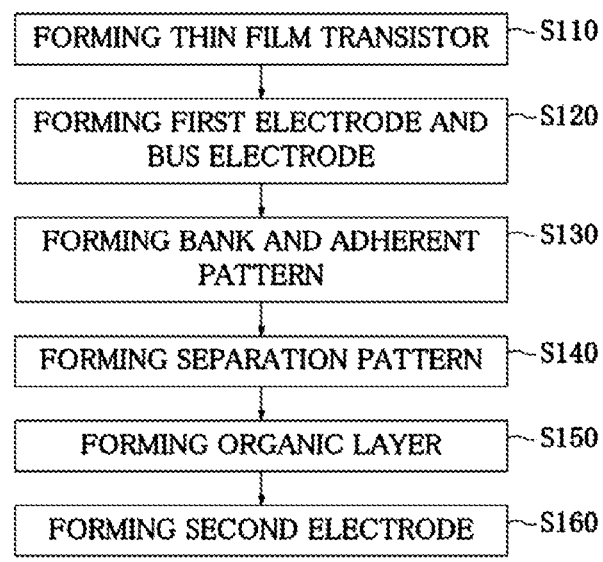
FIG. 5 is a flowchart showing a manufacturing method of an organic light emitting display apparatus according to various embodiments of the present invention.
Figure 6:
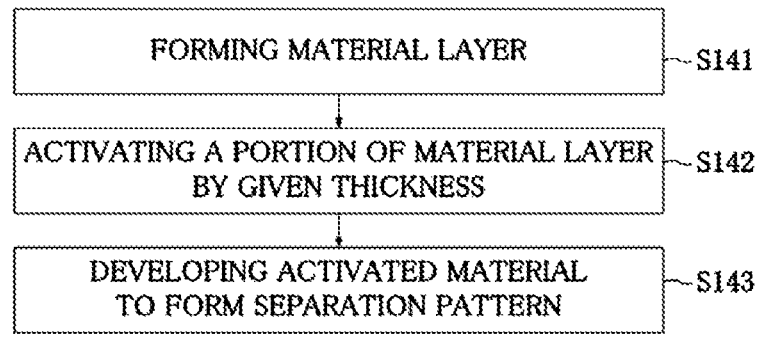
FIG. 6 is a flowchart showing "formation of separation pattern" as illustrated in FIG. 5.

FIG. 5 is a flowchart showing a manufacturing method of the organic light emitting display apparatus according to various embodiments of the present invention, FIG. 6 is a flowchart showing "formation of separation pattern" of FIG. 5, and FIGS. 7A to 7I are views showing the sequence of respective operations of FIGS. 5 and 6.

As exemplarily shown in FIG. 5, the manufacturing method of the organic light emitting display apparatus in accordance with various embodiments of the present invention includes forming the plurality of thin film transistors TFT corresponding to the plurality of pixel areas PA (S110). Then, the first electrode 121 and the bus electrode 122 are formed on the overcoat layer 114, which covers the plurality of thin film transistors TFT, the first electrode 121 corresponding to emission area EA of each pixel area PA, the bus electrode 122 corresponding to at least a portion of the non-emission area NEA of the plurality of pixel areas PA (S120). The method includes forming the bank 123 overlapping the rim of the first electrode 121 on the overcoat layer 114 and forming the adherent pattern 124 on the at least a portion of the bus electrode 122 (S130), and forming the separation pattern 125 covering at least a top portion of the adherent pattern 124 and having inverted-tapered cross section (S140). Then, the organic layer 126 is formed on the first electrode 121, on the separation pattern 125, and on the remaining portion of the bus electrode 122 except for the crevice 125d (S150). The method then includes forming the second electrode 127 connecting to the bus electrode 122 via the crevice 125d (S160).

As exemplarily shown in FIG. 6, formation of the separation pattern includes forming a material layer on the overcoat layer 114 to cover the first electrode 121, the bus electrode 122, the bank 123 and the adherent layer 124 (S141); selectively activating a portion of the material layer (S142) by a given thickness; and developing the activated material layer to form the separation pattern (S143).

Figure 7A:
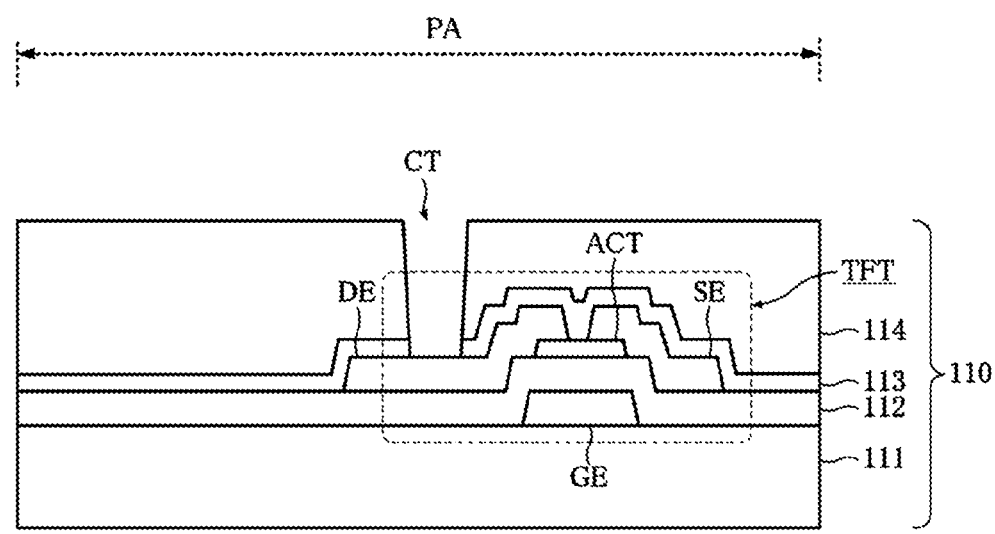
FIGS. 7A to 7I are views sequentially showing respective operations of FIGS. 5 and 6.

As exemplarily shown in FIG. 7A, the plurality of thin film transistors TFT corresponding to the plurality of pixel areas PA are formed on the substrate 111. (S110)

For example, the formation of thin film transistor TFT includes forming the gate line GL and the gate electrode GE connecting to the gate line GL on the substrate 111. Then, the gate insulating layer 112 covering the gate line GL and the gate electrode GE is formed. The active layer ACT overlapping the gate electrode GE is formed on the gate insulating layer 112. The data line DL intersecting the gate line GL is formed, and the source electrode SE and the drain electrode DE are formed in contact with both sides of the active layer ACT and spaced apart from each other. The protection layer 113 is formed to cover the data line DL, source electrode SE and drain electrode DE on the entire surface of the gate insulating layer 112. Then, the overcoat layer 114 is formed on the protection layer 113 evenly. One of the source electrode SE and the drain electrode DE is connected to the data line DL.

The formation of thin film transistor TFT further includes forming the contact hole CT penetrating the protection layer 113 and the overcoat layer 114 to expose the other one of source electrode SE and the drain electrode DE not connected to the data line DL, after the formation of the overcoat layer 114.

Although not shown, the first pad layer CPD1 of GIG. 4 is formed simultaneously with the formation of the gate electrode GE or the formation of the source and drain electrodes SE, DE. The contact hole penetrating at least the protection layer 113 and the overcoat layer 114 to expose the first pad layer CPD is formed at the formation of the contact hole CT exposing the one of the source and drain electrodes SE, DE.

Figure 7B:
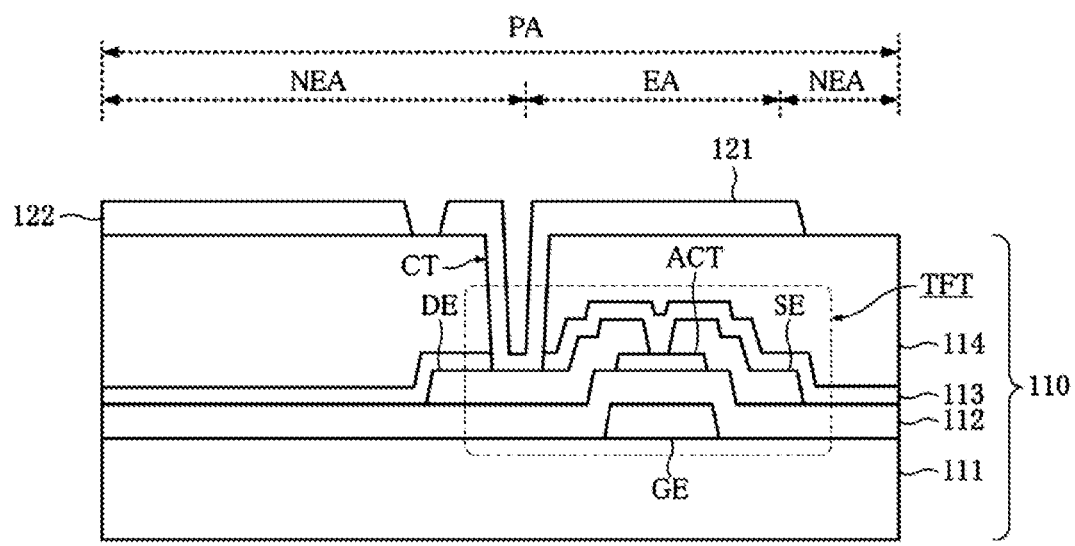

As exemplarily shown in FIG. 7B, the first electrode 121 corresponding to the emission area EA of each pixel area PA, and the bus electrode 122 corresponding to at least a portion of the non-emission area NEA of the plurality of pixel areas PA are formed on the overcoat layer 114. (S120)

Formation of the first electrode 121 and bus electrode 122 (S120) includes forming a conductive film (not shown) on the entire surface of the overcoat layer 114, and patterning the conductive film (not shown) to form the first electrode 121 and bus electrode 122 insulated from each other.

In this case, the first electrode 121 is electrically connected to the thin film transistor TFT via the contact hole CT.

Alternatively, the bus electrode 122 may be formed to be mesh-shaped on the entire surface of the overcoat layer 114 and spaced apart from the first electrode 121 by a given distance.

The first electrode 121 and bus electrode 122 may be formed of a transparent conductive material.

Alternatively, when the organic light emitting display apparatus is a top emission type, the first electrode 121 and bus electrode 122 may be provided in a stack of multiple layers including a reflective conductive material. In one example, both of the first electrode 121 and bus electrode 122 may include a first layer formed of any one of Al and Ag or an alloy thereof, and a second layer formed of a material having a work function similar to the organic layer 126. In this case, the second layer may be formed of Indium Tin Oxide (ITO). The first layer may be disposed on the overcoat layer 114 and the second layer may be disposed on the first layer.

Although not shown, the second pad layer CPD2 of FIG. 4 may be formed simultaneous with the formation of the first electrode 121 and the bus electrode 122. The second pad layer CPD2 is connected to the first pad layer CPD1 through the contact hole exposing the first pad layer CPD1.

Figure 7C:
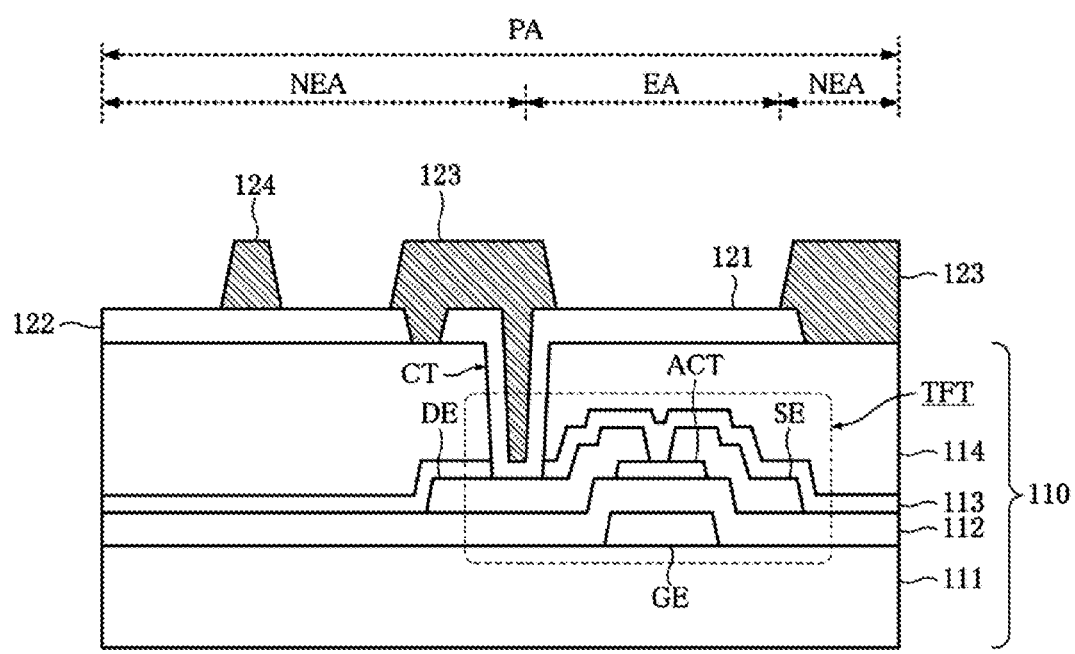

As exemplarily shown in FIG. 7C, the bank 123 is formed on the overcoat layer 114. At the same time, the adherent pattern 124 is formed on the at least a portion of the bus electrode 122. (S130)

Formation of the bank 123 and the adherent pattern 124 (S130) includes forming an organic insulator film (not shown) covering the first electrode 121 and bus electrode 122 on the entire surface of the overcoat layer 114, and patterning the organic insulator film (not shown) to form the bank 123 and the adherent pattern 124.

In this case, the organic insulator film (not shown), i.e., the bank 123 and the adherent pattern 124, may be formed of a polyimide-based material or photo-acryl.

The bank 123 and the adherent pattern 124, which are formed simultaneously by patterning the organic insulator film (not shown) using the same mask, have upper surfaces having the same height. In addition, the bank 123 and the adherent pattern 124 may have a tapered shape in consideration of material characteristics of the organic insulator film (not shown).

Figure 7D:
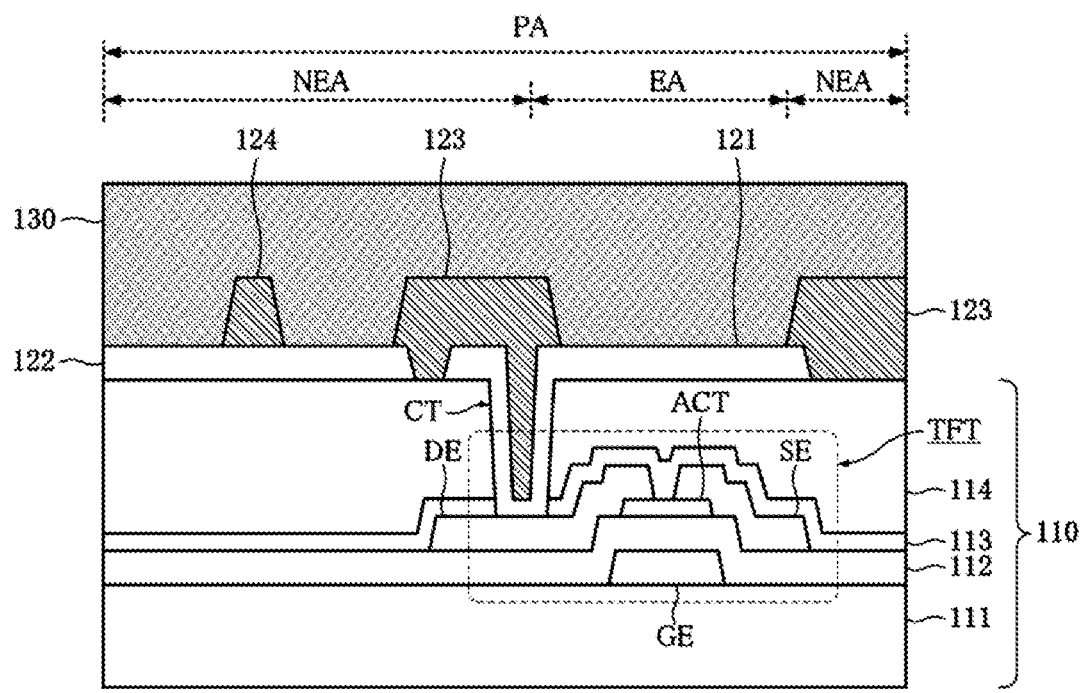

As exemplarily shown in FIG. 7D, a material layer 130 is formed on the entire surface of the overcoat layer 114 to cover the bank 123 and the adherent pattern 124 (S141). In this case, the material layer 130 may be any one material selected from various materials, e.g., insulator materials, so long as the material may form an inverted-tapered structure having a side edge inclined by two or more different gradients, e.g., via activation and developing thereof.

For example, the material layer 130 may be formed of a negative photoresist material. The negative photoresist material is one selected from novolak group, polyimide group and polyacryl group. In one or more embodiments, activating the material (e.g., with a photoresist) may include exposing the material to light.

Figure 7E:
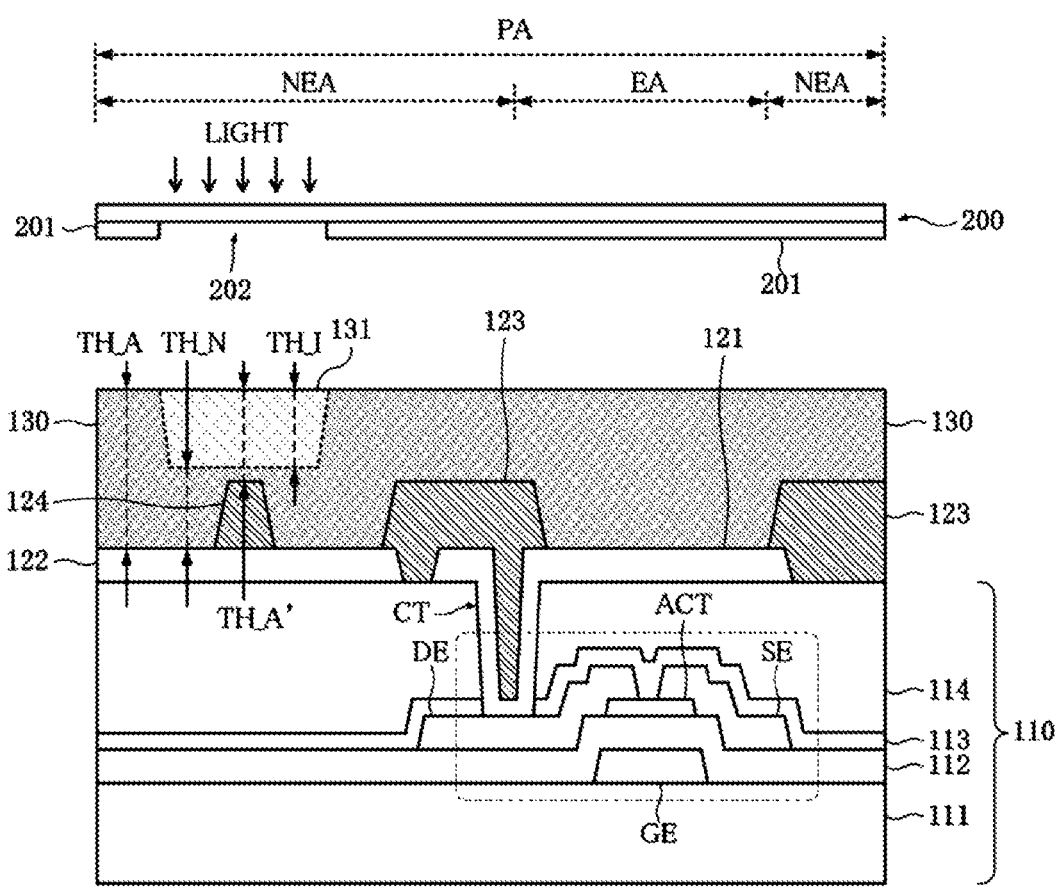

As exemplarily shown in FIG. 7E, in a state in which a mask 200 is aligned on the material layer 130, light is emitted to the material layer 130 to activate a portion of the material layer 130 by a given thickness TH_I (S142).

The mask 200 includes an opening 202 corresponding to a portion of the bus electrode 122 surrounding the adherent pattern 124 and a shielding portion 201 being a peripheral region of the opening 202. For example, the opening 202 may correspond to at least the portion of the bus electrode 122, on which the adherent pattern 124 is disposed.

Upon activation of the material layer 130 (S142), a process time for which the portion 131 of the material layer 130 is exposed by light is adjusted such that the thickness TH_I of the portion 131 of the material layer 130 activated by light is less than the entire thickness TH_A of the material layer 130.

In one example, the thickness TH_I of the activated portion 131 of the material layer 130 may be less than the thickness TH_A' of the material layer 130 stacked on the adherent pattern 124. That is, the activated portion 131 of the material layer 130 is spaced apart from the adherent pattern 124.

Because the thickness TH_I of the activated portion 131 of the material layer 130 is less than the entire thickness TH_A of the material layer 130, the separation pattern 125 having a side edge inclined by two or more different gradients is formed. In other words, if the thickness TH_I of the activated portion 131 of the material layer 130 is identical to the entire thickness TH_A of the material layer 130, the separation pattern 125 having the side edge inclined by only one gradient is formed.

Next, the activated material layer portion (131 of FIG. 7E) is subjected to developing, such that the separation pattern 125 is formed. (S143) In one or more embodiments, developing may be effected by heating.

Figure 7F:
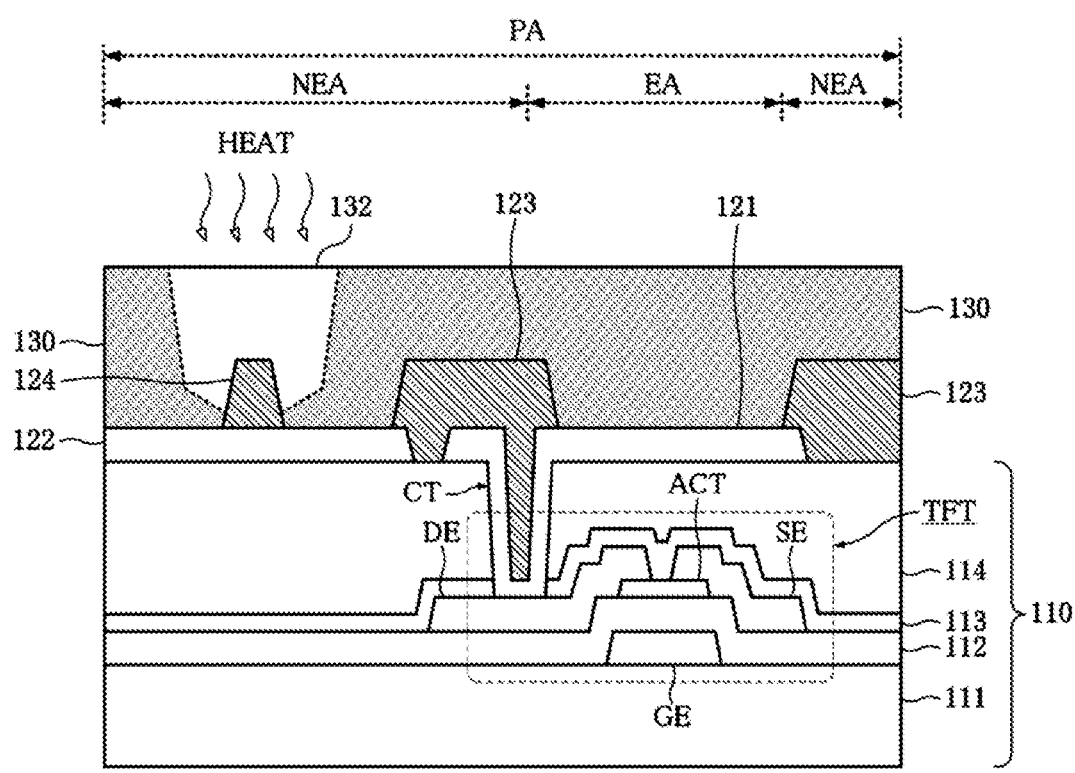

For example, as exemplarily shown in FIG. 7F, when the activated portion (131 of FIG. 7E) of the material layer 130 is heated, the activated portion is polymerized. At the same time, a portion of the activated portion 131 or a polymerized portion 132 of the material layer 130 is formed above the adherent pattern 124. Therefore, the separation pattern 125 which is formed of polymerized portion 132 of the material layer 130 has the side edge inclined by two or more different gradients.

Next, the remaining portion of the material layer 130 except for the polymerized portion 132 is removed.

Figure 7G:
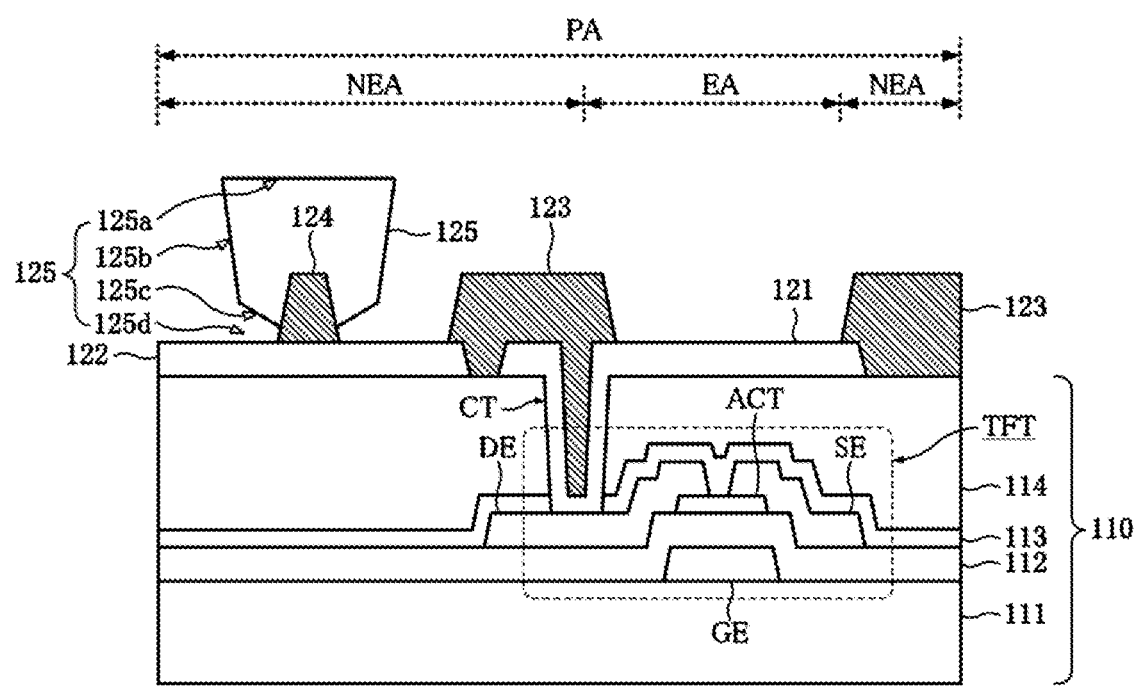

As exemplarily shown in FIG. 7G, the separation pattern 125 covering at least top portion of the adherent pattern 124 and having the inverted-tapered shape cross section is formed.

In one example, at least one side edge of the separation pattern 125 includes a first side 125b adjoining the upper edge 125a and inclined by a first gradient A1 (see e.g., FIG. 3A), and a second side 125c extending from the first side 125b to the bus electrode 122 along the adherent pattern 124 and inclined by a second gradient A2 (see, e.g., FIG. 3A) smaller than the first gradient A1.

In this regards, the first gradient A1 may be greater than or equal to 45°, also smaller than or equal to 90°. (45°≤A1≤90°) The second gradient A2 may be greater than or equal to 0°, also smaller than the first gradient A1. (0°≤A2≤A1)

The first and second gradients A1, A2 respectively correspond to an amount of process time for activating the portion 131 of the material layer 130 (S142) and an amount of process time for developing the portion 132 of the material layer 130 (S143).

In this way, the crevice 125d having a given width W_CV is formed by the separation pattern 125. The crevice 125d corresponds to at least a portion of the bus electrode 122 surrounding the adherent pattern 124 and being hidden by the separation pattern 125 in the vertical direction.

Figure 7H:
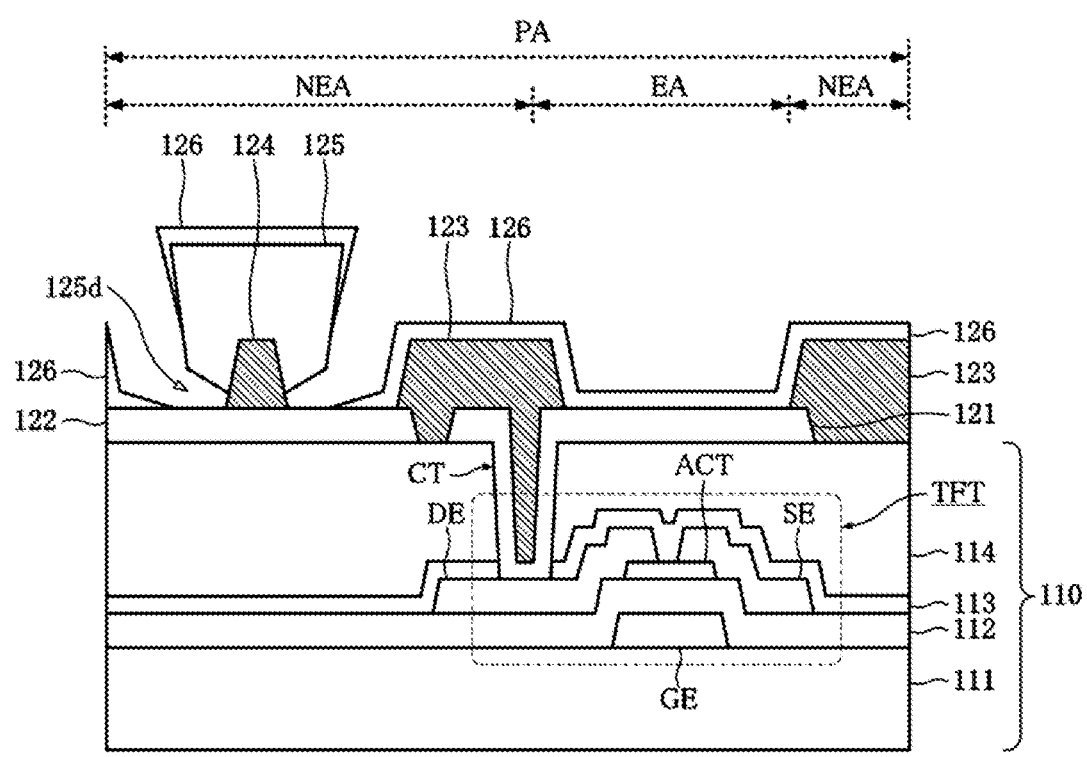

Next, as exemplarily shown in FIG. 7H, the organic layer 126 is formed on the first electrode 121, the bank 123 and the separation pattern 125. Also, the organic layer 126 is formed on the remaining area of the bus electrode 122 except in the crevice 125d. (S150).

In the formation of the organic layer 126 (S150), the organic layer 126 is formed by an anisotropic deposition method. Therefore, the organic layer 126 is not formed on a portion of the bus electrode 122 corresponding to the crevice 125d. That is, the crevice 125d of the bus electrode 122 is hidden by the separation pattern 125. Therefore, the organic layer 126 is not formed in the crevice 125d such that the bus electrode 122 in the crevice 125d is exposed.

Though not shown in FIG. 7H, the organic layer 126 may be a stack of multiple layers including an electron injection layer, an electron transportation layer, the emission layer, a hole transportation layer, and a hole injection layer which are formed of organic materials having different components or compositions.

Figure 7I:
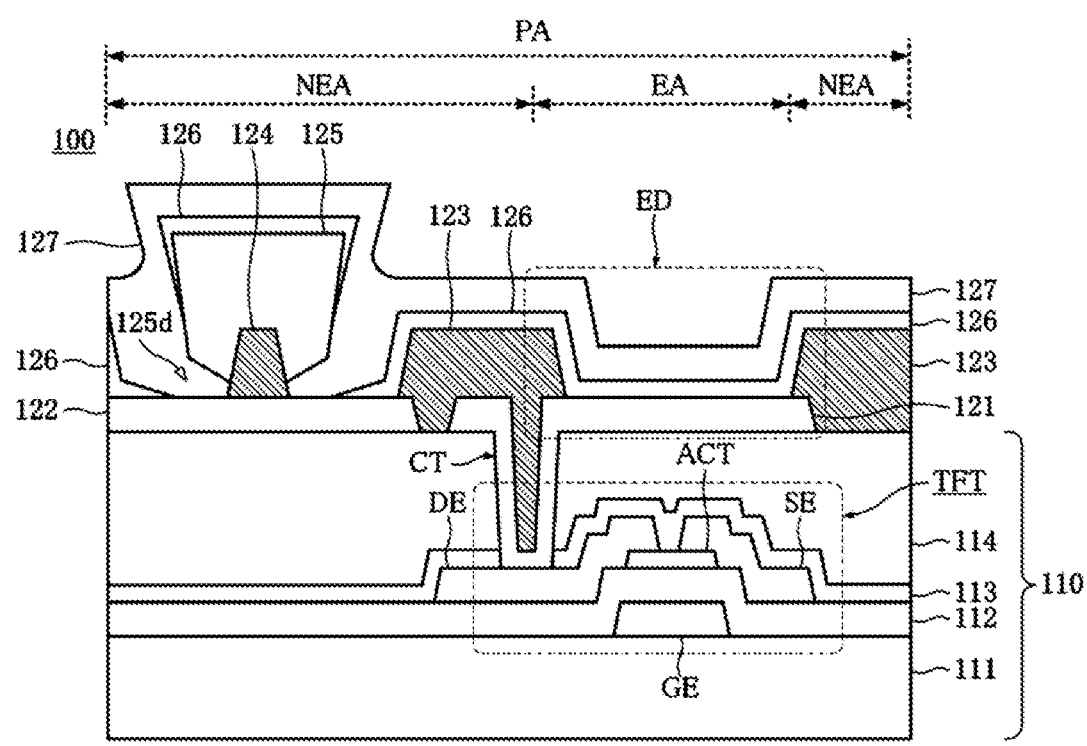

As exemplarily shown in FIG. 7I, a conductive material is stacked on the entire surface of the organic layer 126 to form the second electrode 127 (S160).

In the formation of the second electrode 127 (S160), the second electrode 127 is formed by an isotropic deposition method, such as atomic layer deposition (ALD) or sputtering. Therefore, the second electrode 127 is formed not only on the organic layer 126 but also in the crevice 125*d* of the bus electrode 122 in which the organic layer 126 is not formed by the separation pattern 125. The second electrode 127 and the bus electrode 122 are connected to each other via the crevice 125*d*.

As is apparent from the above description, the organic light emitting display apparatus in accordance with various embodiments of the present invention includes the bus electrode 122 to reduce a resistance of the second electrode 127 formed on the entire surface thereof, and the separation pattern 125 to create the crevice 125*d* where the organic layer 126 is not formed. Connection between the bus electrode 122 and the second electrode 127 may be accomplished without patterning of the organic layer 126. The second electrode 127 connected to the bus electrode 122 may exhibit a reduced resistance, which may prevent deterioration of brightness and increased power consumption due to a high resistance of the second electrode 127.

In addition, the separation pattern 125 is formed to cover at least a top portion of the adherent pattern 124, which is formed on a portion of the bus electrode 122. That is, the separation pattern 125 is adhered to the adherent pattern 124, rather than the bus electrode 122. This may prevent easy peeling of the separation pattern 125 and deterioration of resolution due to spots. Moreover, the width W_CV of the crevice 125*d* defined by the separation pattern 125 may be restricted to a given range by the adherent pattern 124, which may provide improved uniformity of the width of the crevice 125*d*. As a result, the connection reliability between the bus electrode 122 and the second electrode 127 may be improved. Consequently, the reliability of the organic light emitting display apparatus may be improved.

It will be apparent that to those skilled in the art that various modifications and variations can be made in the organic light emitting display apparatus of the present invention without departing from the spirit or scope of the invention. Thus, it is intended that the present invention cover the modifications and variations of this invention provided they come within the scope of the appended claims and their equivalents.

What is claimed is:

1. An organic light emitting display apparatus, comprising:
    a plurality of pixel areas, each pixel area comprising an emission area and a non-emission area;
    a thin film transistor including a gate electrode, a source electrode, and a drain electrode;
    a first electrode in the emission area of each pixel area and contacting the drain electrode;
    a bus electrode in at least a portion of the non-emission areas of the plurality of pixel areas;
    an adherent pattern on a portion of the bus electrode;
    a separation pattern covering at least a top portion of the bus electrode and having an inverted tapered shape cross section to define a crevice under the separation pattern and above the bus electrode;
    an organic layer on the first electrode and the separation pattern, and further disposed on a remaining portion of the bus electrode except for a portion corresponding to the crevice which is disposed under the separation pattern, wherein the organic layer includes an emission layer; and
    a second electrode on the organic layer and further disposed in the crevice, the second electrode contacting the bus electrode via the crevice,
    wherein an entirety of the separation pattern is spaced apart from the bus electrode.

2. The organic light emitting display apparatus of claim 1, further comprising a bank covering a rim of the first electrode, wherein the adherent pattern is formed of the same material as the bank at the same layer as the bank.

3. The organic light emitting display apparatus of claim 1, wherein the separation pattern is formed of negative photoresist material.

4. The organic light emitting display apparatus of claim 1,
    wherein at least one side edge of the cross section of the separation pattern includes a first side adjoining an upper edge and inclined by a first gradient, and a second side extending from the first side to the bus electrode and inclined by a second gradient smaller than the first gradient,
    wherein the first gradient is greater than or equal to 45° and smaller than or equal to 90°, and
    wherein the second gradient is greater than or equal to 0° and smaller than the first gradient.

5. The organic light emitting display apparatus of claim 1, wherein the bus electrode is formed of the same material as the first electrode at the same layer as the first electrode, and the bus electrode is not connected to the first electrode.

6. The organic light emitting display apparatus of claim 1, wherein the first electrode directly contacts the drain electrode.

7. A method of manufacturing an organic light emitting display apparatus, the method comprising:
    forming a plurality of thin film transistors in a plurality of pixel areas, each of the thin film transistors including a gate electrode, a source electrode, and a drain electrode;
    forming an overcoat layer covering the plurality of thin film transistors and having a contact hole on the drain electrode;
    forming a first electrode in an emission area of each pixel area and contacting the drain electrode via the contact hole, and a bus electrode in at least a portion of non-emission areas of the plurality of pixel areas on the overcoat layer;
    forming an adherent pattern on a portion of the bus electrode;
    forming a separation pattern covering at least a top portion of the adherent pattern and having an inverted tapered shape cross section to define a crevice under the separation pattern and above the bus electrode;
    forming an organic layer on the first electrode and the separation pattern, and on a remaining portion of the bus electrode except for a portion corresponding to the crevice which is disposed under the separation pattern, wherein the organic layer includes an emission layer; and
    forming a second electrode on the organic layer and in the crevice, the second electrode contacting the bus electrode via the crevice,
    wherein an entirety of the separation pattern is spaced apart from the bus electrode.

8. The method of claim 7, further comprising a bank covering a rim of the first electrode is formed on the overcoat layer.

9. The method of claim 8, wherein the forming the separation pattern comprises:
    forming a material layer over an entire surface of the overcoat layer, the material layer covering the first electrode, the bus electrode, and the bank;

selectively activating a portion of the material layer surrounding the adherent pattern by a given thickness; and developing the activated portion of the material layer to form the separation pattern.

10. The method of claim 9, wherein the thickness of the activated portion of the material layer is less than the entire thickness of the material layer, wherein, upon the development of the activated portion of the material layer, the activated portion is disposed above the adherent pattern such that the separation pattern is formed to cover at least top portion of the adherent pattern, wherein at least one side edge of the cross section of the separation pattern comprises a first side adjoining an upper edge and inclined by a first gradient, and a second side extending from the first side to the bus electrode and inclined by a second gradient smaller than the first gradient, wherein the first gradient is greater than or equal to 45° and smaller than or equal to 90°, and wherein the second gradient is greater than or equal to 0° and smaller than the first gradient.

11. The method of claim 9, wherein the material layer is formed of a negative photoresist material.

12. The method of claim 9, wherein, upon the activation of the portion of the material layer, the activated portion is spaced apart from the adherent pattern.

13. The method of claim 7, wherein the organic layer is formed by an anisotropic deposition method, and wherein the second electrode is formed by an isotropic deposition method.

14. The method of claim 7, wherein the first electrode directly contacts the drain electrode via the contact hole.

* * * * *